US008685597B2

(12) United States Patent
Sullivan et al.

(10) Patent No.: US 8,685,597 B2
(45) Date of Patent: Apr. 1, 2014

(54) FORMING A BRIDGING FEATURE USING CHROMELESS PHASE-SHIFT LITHOGRAPHY

(75) Inventors: Daniel B. Sullivan, Carver, MN (US); Sangho Kim, St. Paul, MN (US)

(73) Assignee: Seagate Technology LLC, Cupertino, CA (US)

( * ) Notice: Subject to any disclaimer, the term of this patent is extended or adjusted under 35 U.S.C. 154(b) by 127 days.

(21) Appl. No.: 13/268,285

(22) Filed: Oct. 7, 2011

(65) Prior Publication Data

US 2013/0089753 A1    Apr. 11, 2013

(51) Int. Cl.
*G03F 1/34* (2012.01)

(52) U.S. Cl.
USPC ............................................ 430/5; 430/311

(58) Field of Classification Search
USPC .................. 430/5, 322, 323, 324, 394, 311
See application file for complete search history.

(56) References Cited

U.S. PATENT DOCUMENTS

| 5,273,850 | A  | 12/1993 | Lee et al. |
| 5,362,584 | A  | 11/1994 | Brock et al. |
| 5,487,962 | A  | 1/1996  | Rolfson |
| 5,675,164 | A  | 10/1997 | Brunner et al. |
| 6,541,167 | B2 | 4/2003  | Petersen et al. |
| 7,354,682 | B1 | 4/2008  | Capodieci |
| 7,419,748 | B1* | 9/2008  | Ahn ................................. 430/5 |
| 7,618,751 | B2 | 11/2009 | Sandstrom et al. |
| 2006/0147813 | A1 | 7/2006 | Tan et al. |
| 2006/0292455 | A1 | 12/2006 | Cheng et al. |
| 2008/0160428 | A1 | 7/2008 | Ha |
| 2008/0284996 | A1 | 11/2008 | Lei et al. |

OTHER PUBLICATIONS

Feb. 28, 2013 File History for U.S. Appl. No. 13/268,296 retrieved from U.S. Patent and Trademark Office Pair System on Feb. 28, 2013, 89 pages.
Ferguson et al., "Pattern-Dependent Correction of Mask Topography Effects for Alternating Phase-Shifting Masks", SPIE, vol. 2440, Feb. 1995, pp. 349-360.
Gordon et al.. "Design and Analysis of Manufacturable Alternating Phase-Shifting Masks", 18$^{th}$ Annual BACUS Symposium on Photomask Technology, 1998, 12 pages.
Liu et al., "The Application of Alternating Phase-Shifting Masks to 140 nm Gate Patterning (II): Mask Design and Manufacturing Tolerances", SPIE vol. 3334, 1998, pp. 2-14.
Ryhins et al., "Characterization of Quartz Etched PSM Masks for KrF Lithography at the 100 nm Node", 21$^{st}$ Annual BACUS Symposium on Photomask Technology, 2002, pp. 486-495.
File History for U.S. Appl. No. 13/269,086 retrieved from U.S. Patent and Trademark Office on Jun. 4, 2013, 80 pages.

* cited by examiner

*Primary Examiner* — Stephen Rosasco
(74) *Attorney, Agent, or Firm* — Hollingsworth Davis, LLC

(57) ABSTRACT

First and second anchor features are formed on a photolithography mask, each having a respective center point. An elongated, chromeless, bridging feature is formed between the anchor features. The bridging feature is offset from the center points of the anchor feature to minimize distortions of a corresponding photoresist feature formed by the bridging feature.

17 Claims, 11 Drawing Sheets

FORMING A BRIDGING FEATURE USING CHROMELESS PHASE-SHIFT LITHOGRAPHY

SUMMARY

Various embodiments described herein are generally directed to methods, systems, and apparatuses that facilitate forming features using chromeless, phase-shift lithography. In one example, a method involves forming first and second anchor features on a photolithography mask, each having a respective center point. An elongated, chromeless, bridging feature is formed between the anchor features. The bridging feature is offset from the center points of the anchor feature to minimize distortions of a corresponding photoresist feature formed by the bridging feature.

In another example, a photolithography mask includes first and second anchor features each having a respective center point. An elongated, chromeless, bridging feature extends between the anchor features. The bridging feature is offset from the center points of the anchor feature to minimize distortions of a corresponding photoresist feature formed by the bridging feature.

In another example, an article of manufacture is prepared by a process that at least involves: a) forming photoresist anchor features on the article of manufacture via first and second anchor features of a photolithography mask, each of the first and second anchor features having a respective center point; and b) forming a bridging photoresist feature on the article of manufacture between the anchor features via a bridging feature of the photolithography mask. The bridging feature is offset from the center points of the anchor feature to minimize distortions of the bridging photoresist feature. A width of the bridging photoresist feature may be between 30 nm and 50 nm, and a span of the bridging photoresist feature may be at least ten times greater than the width of the bridging photoresist feature.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1A:
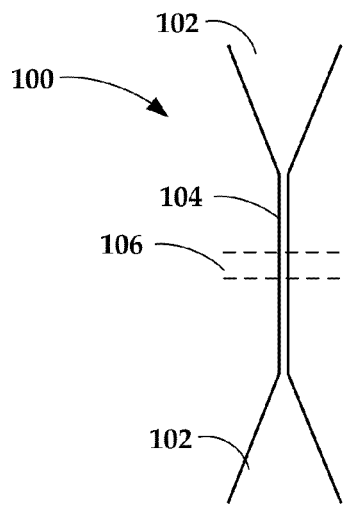
FIG. 1A is an aerial/plan view of a photoresist feature according to an example embodiment.

The present disclosure relates generally to manufacturing techniques and processes that utilize photolithography. For example, various embodiments described below pertain to forming small scale photoresist features using chromeless photolithography masks. Photolithography is part of a process for fabricating microscopic components (e.g., electrical circuits, optical components) that are generally made of thin films layered on a substrate. These processes may involve depositing, then selectively removing, parts of a thin film (or the substrate itself) based on a geometric pattern formed with layer of photoresist material.

In the photolithography process, electromagnetic energy (e.g., light) is transmitted through a mask/reticle to expose parts of the photoresist layer in the desired pattern. The exposed photoresist is subjected to a chemical treatment (e.g., "developing") that removes areas of photoresist that were exposed to the light. In other cases, the areas not exposed to light may instead be removed by the developer. In either case, the resulting surface has a patterned formed by the developed photoresist, and the surface can then be further treated. For example, etching may be performed so that exposed areas of the surface are etched away, while those areas covered by the photoresist are unaffected.

Photolithography is commonly associated with the manufacture of integrated electronic circuit. Photolithography can also used in making integrated optics, which includes optical components (e.g., lasers, waveguides, lenses, mirrors, collimators, etc.) that are formed on a substrate in a manner analogous to integrated electrical circuits. In forming integrated optics, materials and shapes are chosen to have the desired optical characteristics instead of or in addition to desired electrical characteristics.

In the past few decades, the desire to make more densely packed integrated devices has necessitated changes to the photolithography process to form ever-smaller individual feature sizes, often referred to by the term "minimum feature size" or "critical dimension" (CD). The CD is approximated by the formula $CD = k_1 * \lambda / NA$ where $k_1$ a process-specific coefficient, $\lambda$ is the wavelength of applied light/energy, and NA is the numerical aperture of the optical lens as seen from the wafer.

For a given value of $k_1$, the ability to project a usable image of a small feature onto a wafer is limited by the wavelength $\lambda$ and the ability of the projection optics to capture enough diffraction orders from the illuminated mask. When features made from a binary photomask (a pattern of opaque material such as chrome overlaid on a clear substrate such as quartz) are of a certain size and/or shape, the transitions between light and dark at the edges of the projected image may not be sharply defined enough to correctly form the target photoresist features. This may result, among other things, in reducing quality of resist profiles. As a result, features 150 nm or below in size may need to utilize phase shifting to enhance the image quality at the wafer, e.g., sharpening edges of features to improve resist profiles.

Phase-shifting generally involves selectively changing phase of part of the energy passing through a mask/reticle so that the phase-shifted energy is additive or subtractive with unshifted energy at the surface of the wafer. By carefully controlling the shape, location, and phase shift angle of mask features, the resulting photoresist patterns can have more precisely defined edges. These phase shifts may be obtained in a number of ways. For example, one process known as attenuated phase shifting utilizes a layer of non-opaque material that causes light passing through the material to change in phase compared light passing through transparent parts of the mask. Another technique is known as alternating phase shift, where the transparent mask material (e.g., quartz) is etched to different depths. The depths can be chosen to cause a desired relative phase shift in light passing through the different depths.

An alternating phase shift mask can be formed using opaque patterns in combination with phase shifting features. In other cases, what is known as a "chromeless" phase shift mask uses phase shift features alone to define the features. While a chromeless mask may forgo the use of chrome or other opaque features over the entire mask, in the present disclosure the term "chromeless mask" is intended to at least define a particular feature or set of features within the mask that relies on phase shift alone to define a photoresist feature. In such a case, the chromeless mask may use opaque/binary features elsewhere, either with or without phase shifting features.

In reference now to FIG. 1A, a diagram illustrates an example photoresist feature 100, which is a desired shape resulting from light being projected on a wafer through a mask as discussed in detail hereinbelow. The photoresist feature 100 generally includes first and second anchors 102, which in this example are triangular shapes. A bridge 104 is generally an elongated, straight line running from center points of the anchors 102. These features 102, 104 may be used to ensure that material is deposited in a region of interest 106 having a specified dimension and location. After creation and treatment of the photoresist feature 100 (e.g., exposure, development, etching), parts of the feature 100 outside the region of interest 106 may be later removed, e.g., through processes such as chemical mechanical polishing/planarization (CMP).

In one example, this region of interest 106 may define a generally rectangular magnetoresistive stack of a hard drive reader. However, it will be appreciated that a photoresist feature such as feature 100 may be used in forming any related electrical or optical component. For example, any optical or electrical component of conventional and heat assisted recording read/write heads may be formed using a feature similar to feature 100 and parts thereof, including write poles, shields, waveguides, near-field transducers, mirrors, collimators, heaters, etc.

In embodiments described below, the target nominal span length of bridge 104 was 0.50 µm, and the nominal CD of the region of interest is on the order of 50 nm. Accordingly, the span of the bridge is an order of magnitude greater than (e.g., ten times or more than) the width of the span. Although the order of magnitude of these dimensions may have some relevancy to the concepts described herein, it will be appreciated that the embodiments are not intended to only be limited to these values/ranges unless otherwise stated.

Figure 1B:
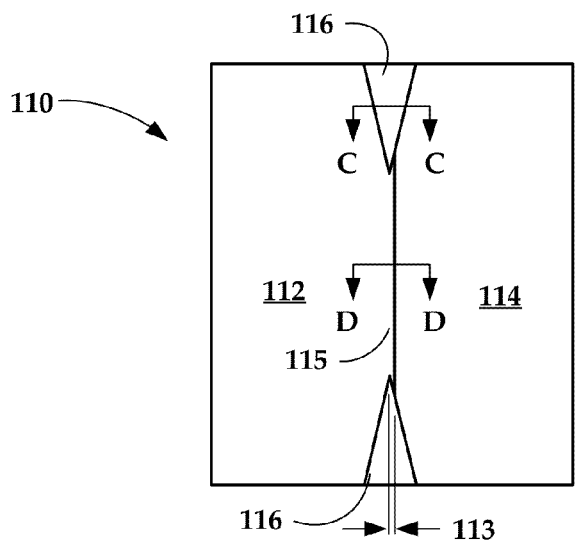
FIG. 1B is an aerial/plan view of a mask according to an example embodiment.

In FIG. 1B, an aerial/plan view shows a mask 110 usable to make the feature 100 shown in FIG. 1A. The anchors 102 are formed by anchor features 116 on the mask 110. The bridging feature 114 is formed by transition 115 between regions 112, 114. The anchor features 116 may use an opaque overlay (e.g., chrome) along with a transition between regions 112, 114, but the bridging transition 115 is at least chromeless. Cross sections C-C and D-D of the mask 110 according to an example embodiment are shown in FIGS. 1C and 1D, respectively.

Figure 1C:
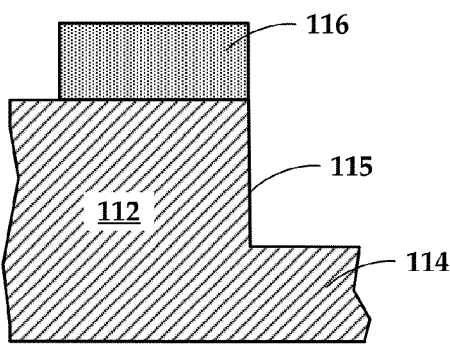
FIGS. 1C and 1D are cross section views corresponding to section lines C-C and D-D, respectively, of the mask shown in FIG. 1B.
Figure 1D:
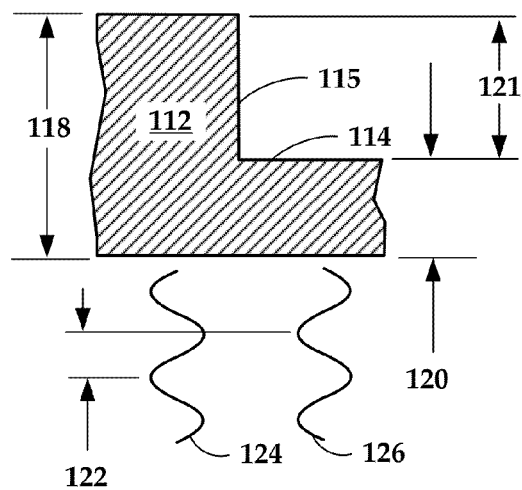

As seen in FIG. 1C, feature 116 is defined by a chrome layer, and one edge of transition 115 may also form part of feature 116 at this location. It can be seen in FIG. 1D seen that there is no chrome overlay along the middle of transition 115 (e.g., at or near area of interest 106), and the transition 115 alone forms the bridge 104 of the photoresist feature 100. Also seen in FIG. 1D, thicknesses 118, 120 of respective portions 112, 114 are different, due to etching by depth 121. This results in light 124 passing through portion 112 having a phase shift 122 relative to light 126 passing through portion 114. The amount of phase shift 122 can be adjusted by changing the etching depth 121, which affects the relative size of dimensions 118, 120.

Figure 2:
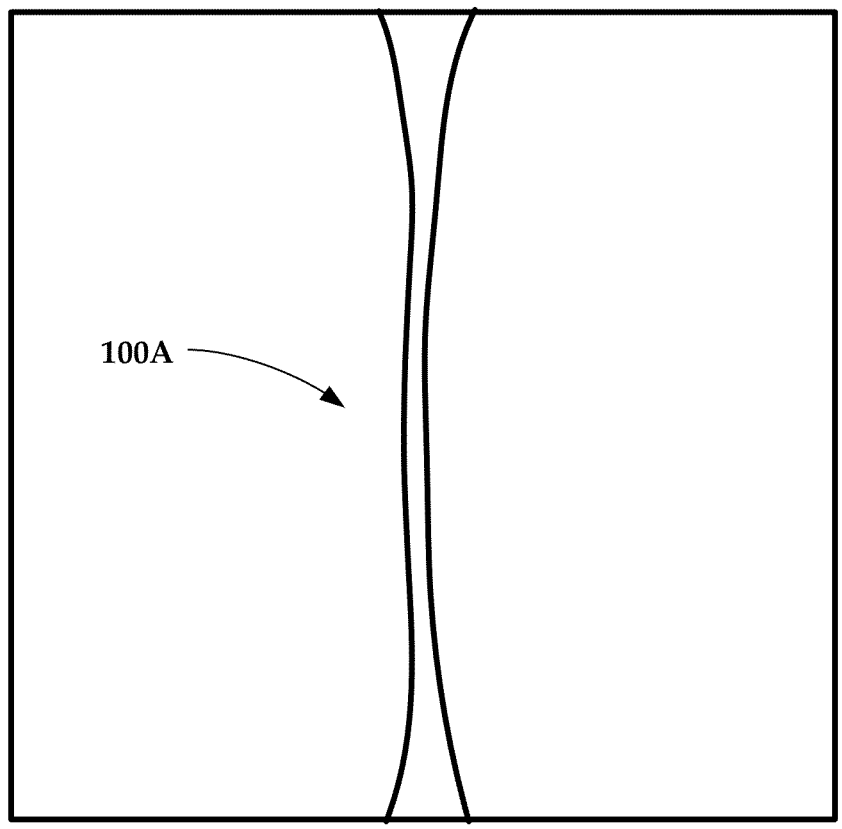
FIG. 2 is a scanning electron microscope image of the fabricated photoresist feature according to an example embodiment.

Trial runs were performed to create feature 100 using a phase shift mask similar to mask 110. In initial runs, the mask 110 was formed with transition 115 extending directly between the centers of features 116. It was observed that the resulting photomask feature corresponding to bridge 104 exhibited bending along its length. An example of this is shown in FIG. 2. A scanning electron microscope image of the fabricated photoresist feature (here designated by reference numeral 100A) is seen in FIG. 2A.

Figure 3:
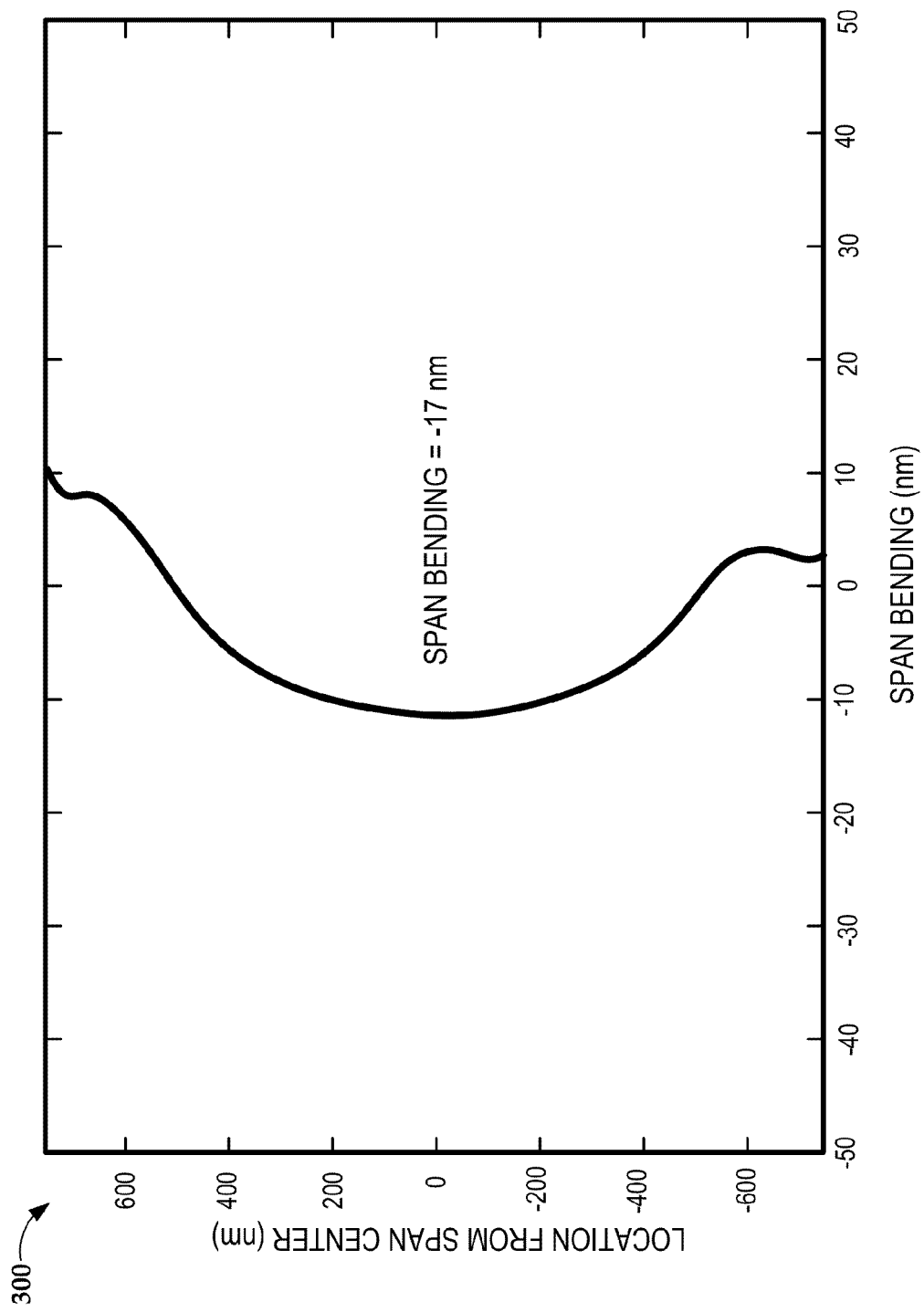
FIG. 3 is a graph which shows bowing of a bridging feature such as shown in FIG. 2.

In FIG. 3, a graph 300 shows amount of bowing/bending of the feature 100A using measurements from the SEM image of FIG. 2A. As indicated in the graph, there is maximum bending of 17 nm in the middle compared to the ends. This amount of bowing is large compared to the nominal CD size of about 50 nm. In some cases, photoresist features are known to distort due to mechanical instability of the photoresist. Therefore, one theory to explain the bending seen in FIGS. 2A, 2B, and 3 is that the bending is caused by mechanical instability due to the thinness (e.g., on the order of 30-50 nm) of the bridge feature 104. However, as will be shown below, even with such small features, bending can be minimized by applying optical proximity correction (OPC) to the mask 110. This suggesting that the bending is due to optical interactions, e.g., due to the nearby anchor features 116, rather than mechanical instability.

Figure 4A:
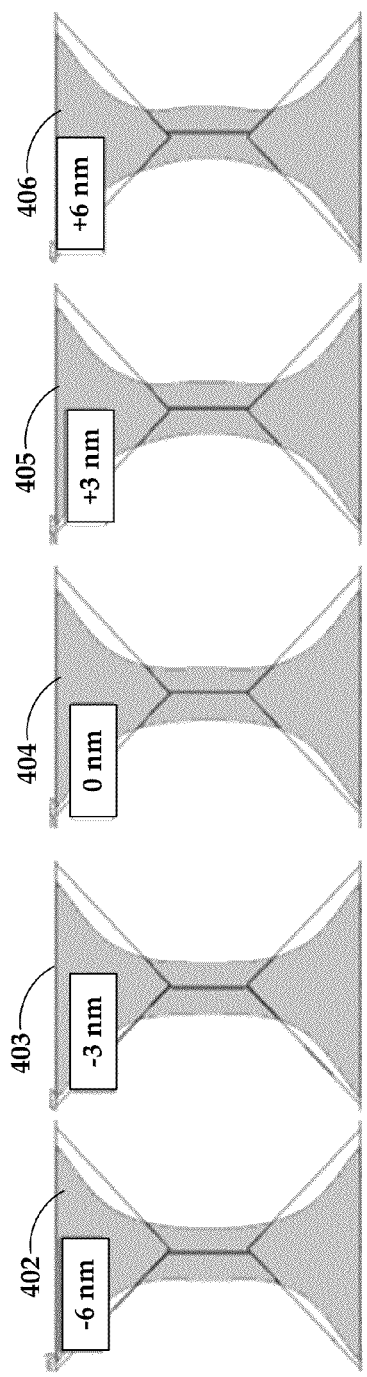
FIG. 4A is a graphical representation of simulations of offset phase shift bridging features according to example embodiments.
Figure 4B:
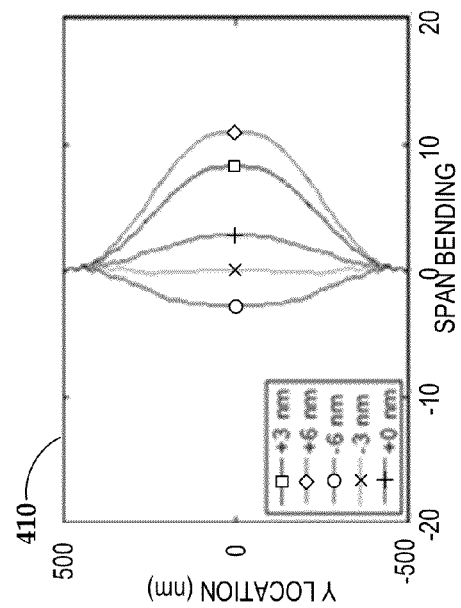
FIGS. 4B-4C are plots quantifying the amount of span bending in the simulation results shown in FIG. 4A.
Figure 4C:
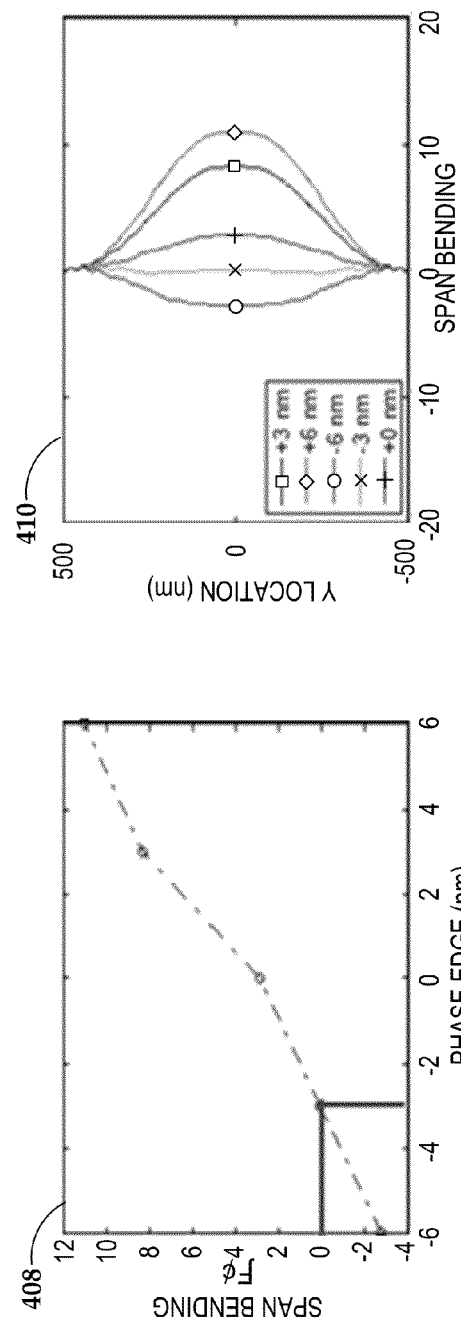

In order to determine how OPC may be applied to correct span bending, a number of simulations were performed, the results of which are shown in FIGS. 4A-4C. In each graphic 402-406, a representation of the mask is overlaid by simulated photoresist feature in grey. For each simulation 402-406, the bridging feature of the mask (e.g., feature 115 in FIG. 1B) is offset by some amount (e.g. offset 113 in FIG. 1B) from center of the anchors (e.g., anchor features 116 in FIG. 1B). For example, in simulation 402 the bridge is offset 6 nm to the left (or −6 nm shift), the left side being the etched, phase-shifted portion of the chromeless feature (e.g., portion 112 in FIGS. 1B-1D) In FIGS. 4B and 4C, graphs 408 and 410 quantify the amount of span bending in response to shifting of the phase edge. These figures indicate that the span bending is minimized at a −3 nm phase edge shift.

Based on the simulation results, a new mask was fabricated with varying levels of offset of the bridge, ranging from 6 nm to −6 nm. Scanning electron microscope images of this mask can be seen in FIG. 5. The sign convention used in expressing these offsets is consistent with the results of FIGS. 4A-4C, e.g., a −3 nm offset in FIG. 4A corresponds to a −3 nm offset in FIG. 5. This is because FIG. 5 shows the side of the mask facing the resist, which is a mirror image compared to the pattern being formed by the mask.

Figure 5:
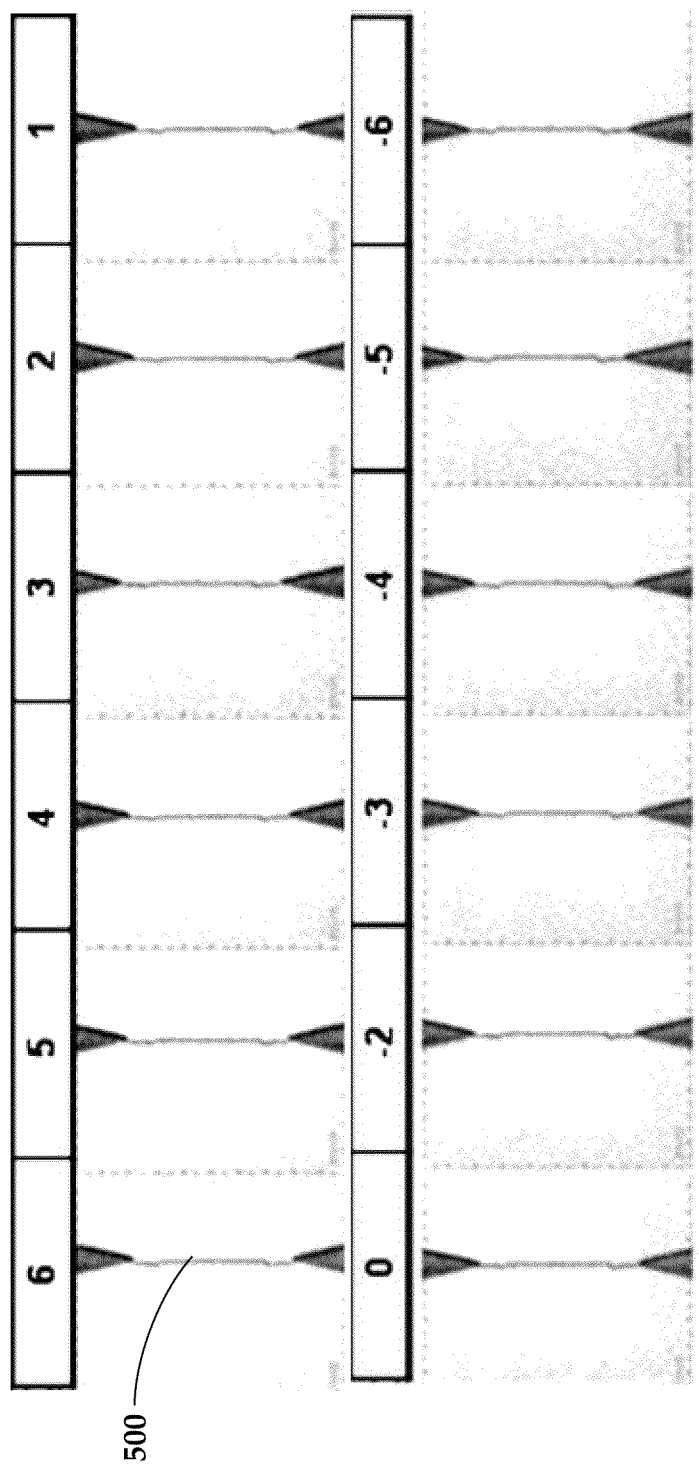
FIG. 5 is a collection of scanning electron microscope images of a mask used to create photoresist features using variable offsets of phase shift bridging features according to example embodiments.
Figure 6:
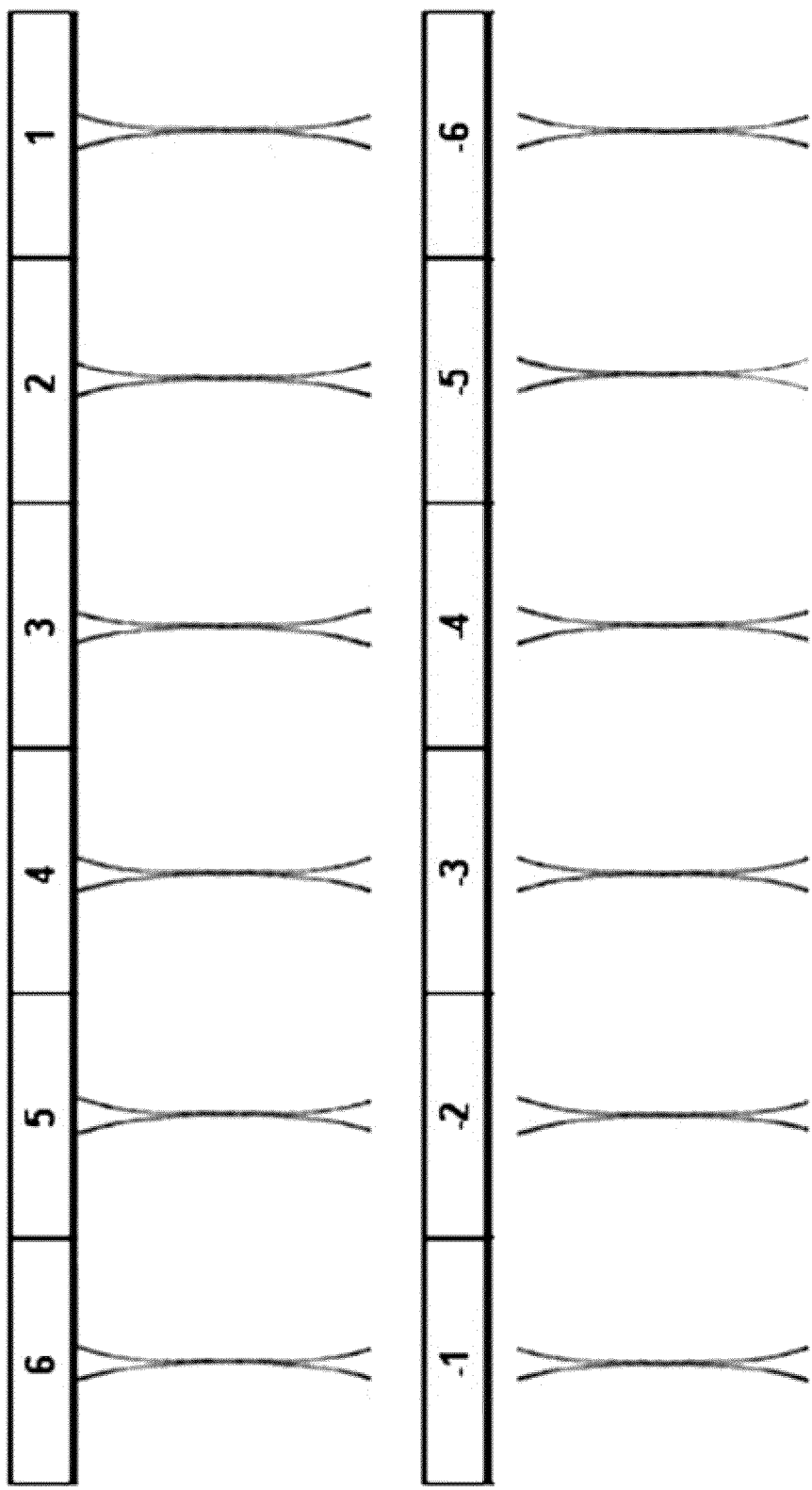
FIG. 6 is a collection of scanning electron microscope images of resist shapes formed from the mask of FIG. 5.
Figure 7:
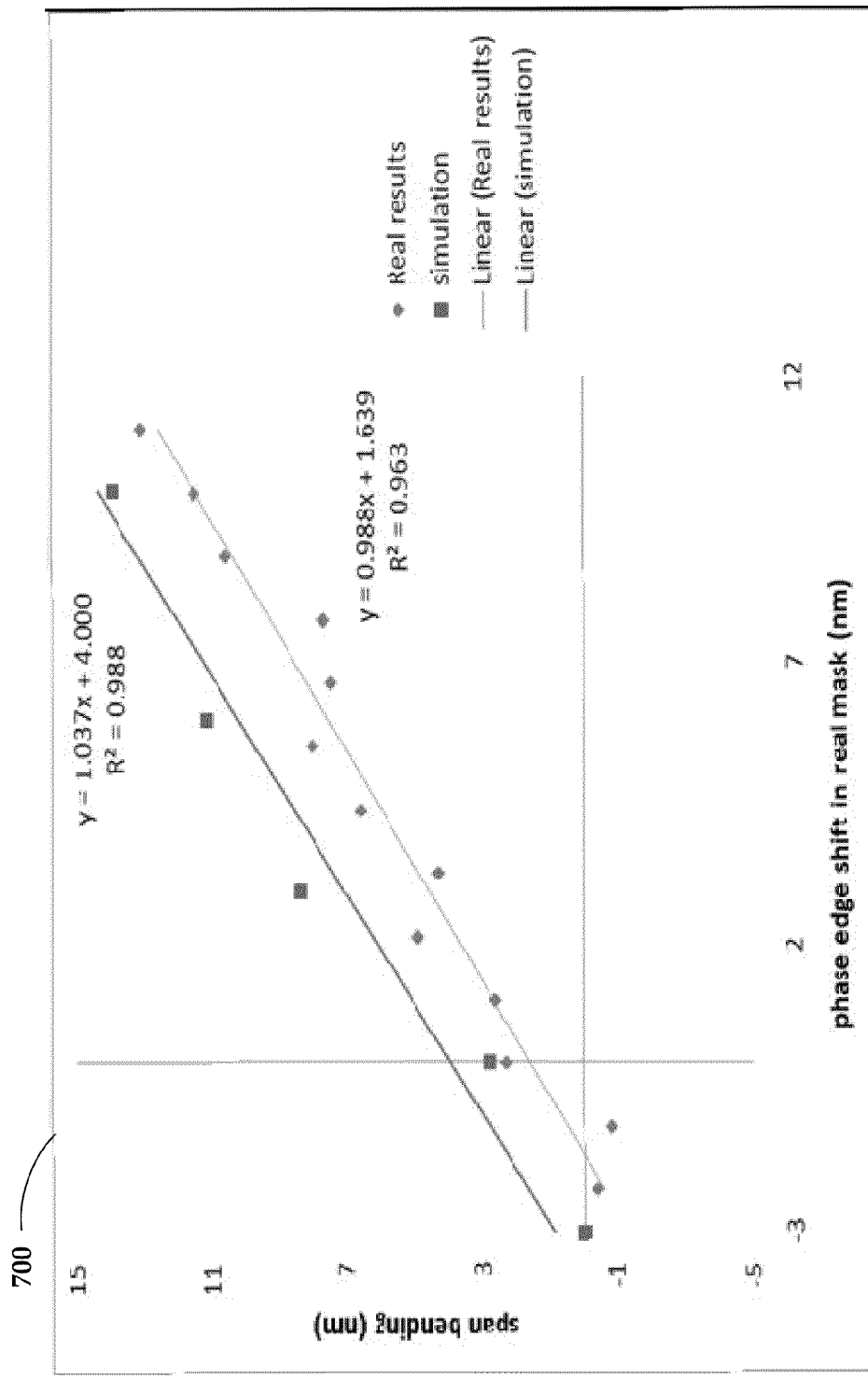
FIG. 7 is a graph of span bending versus the shift of the phase edge derived from the images of FIG. 7.
Figure 8:
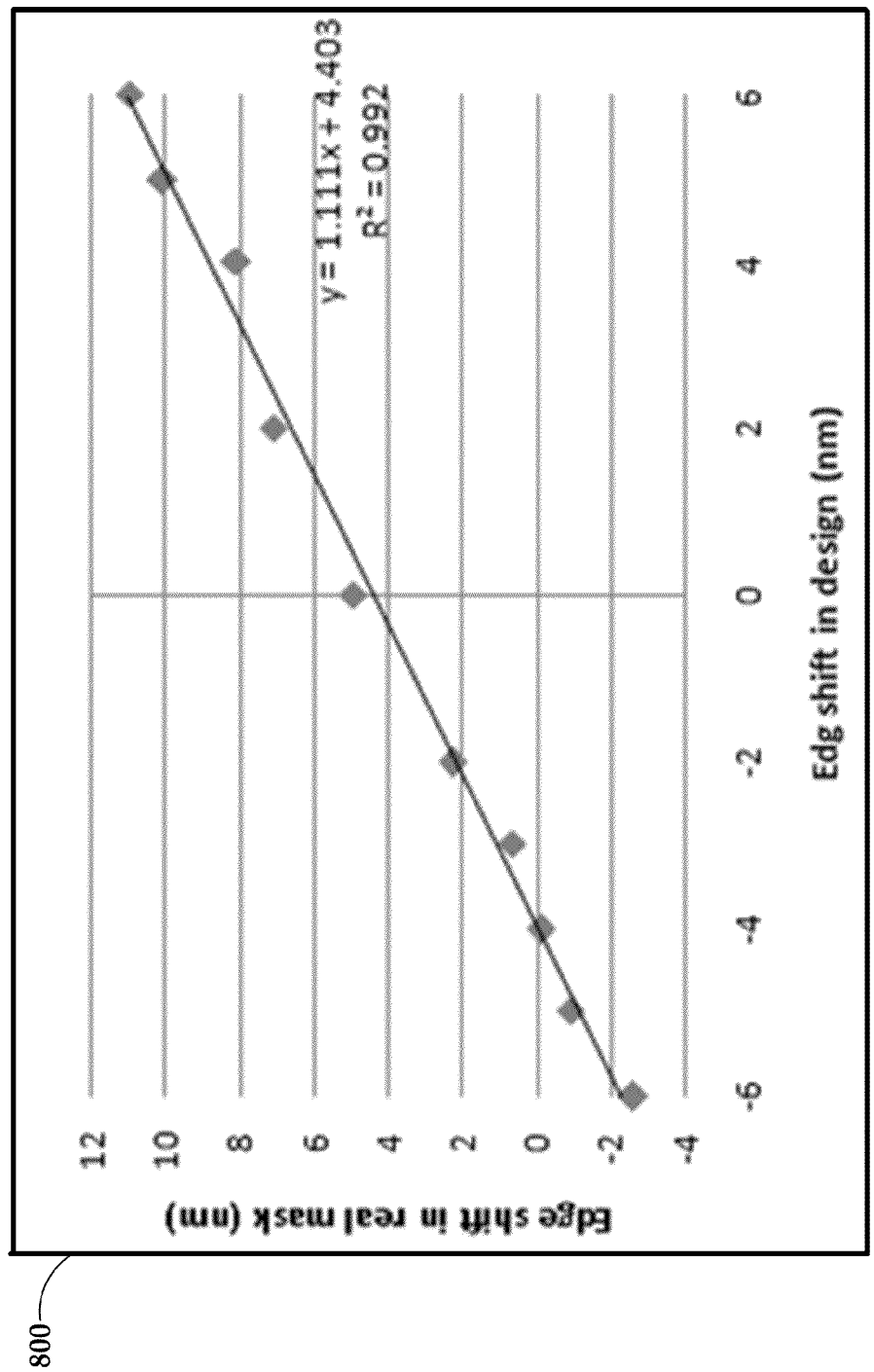
FIG. 8 is a scanning electron microscope image of the fabricated photoresist feature with phase edge offset according to an example embodiment.
Figure 9:
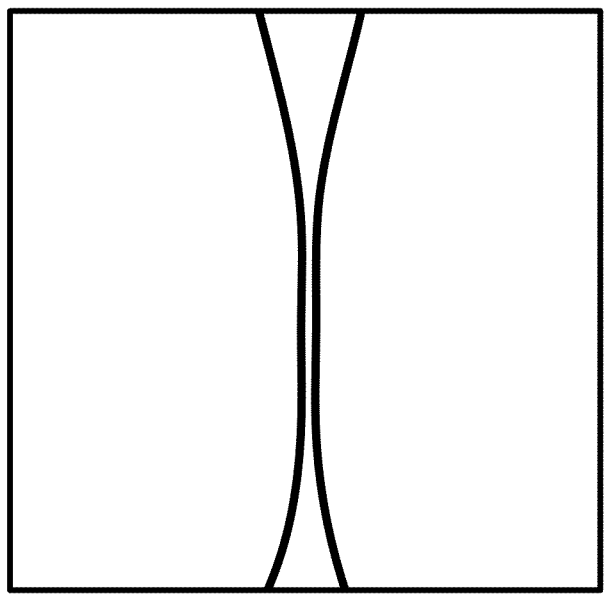
FIG. 9 is a scanning electron microscope image of the fabricated photoresist feature formed using an offset phase transition.

In FIG. 6, SEM images show the resulting resist shapes formed from the mask of FIG. 5. In FIG. 7, a graph 700 illustrates measurements of span bending made on the images of FIG. 6 and shows a comparison between tested and simulated results. Graph 700 suggests that an edge offset of approximately −3 nm minimizes span bending in the resist shape. In FIG. 8, a graph 800 shows the design of the experimental conditions (X-axis) versus the actual experimental conditions (Y-axis). Graph 800 shows how the data in FIG. 7 is likely shifted due to experimental error. In FIG. 9, a SEM image shows the desired shape and sensitivity characteristics of a photoresist bridging feature formed using an offset phase transition.

While a comparison between the simulation results and the tested results shows some difference in offset (e.g., about 2 nm), both graphs are fairly linear and also exhibit a similar slope. Within the general dimensions of the photoresist features described herein, it is expected that a −3 nm shift will provide minimal distortion of the bridging feature.

Figure 10:
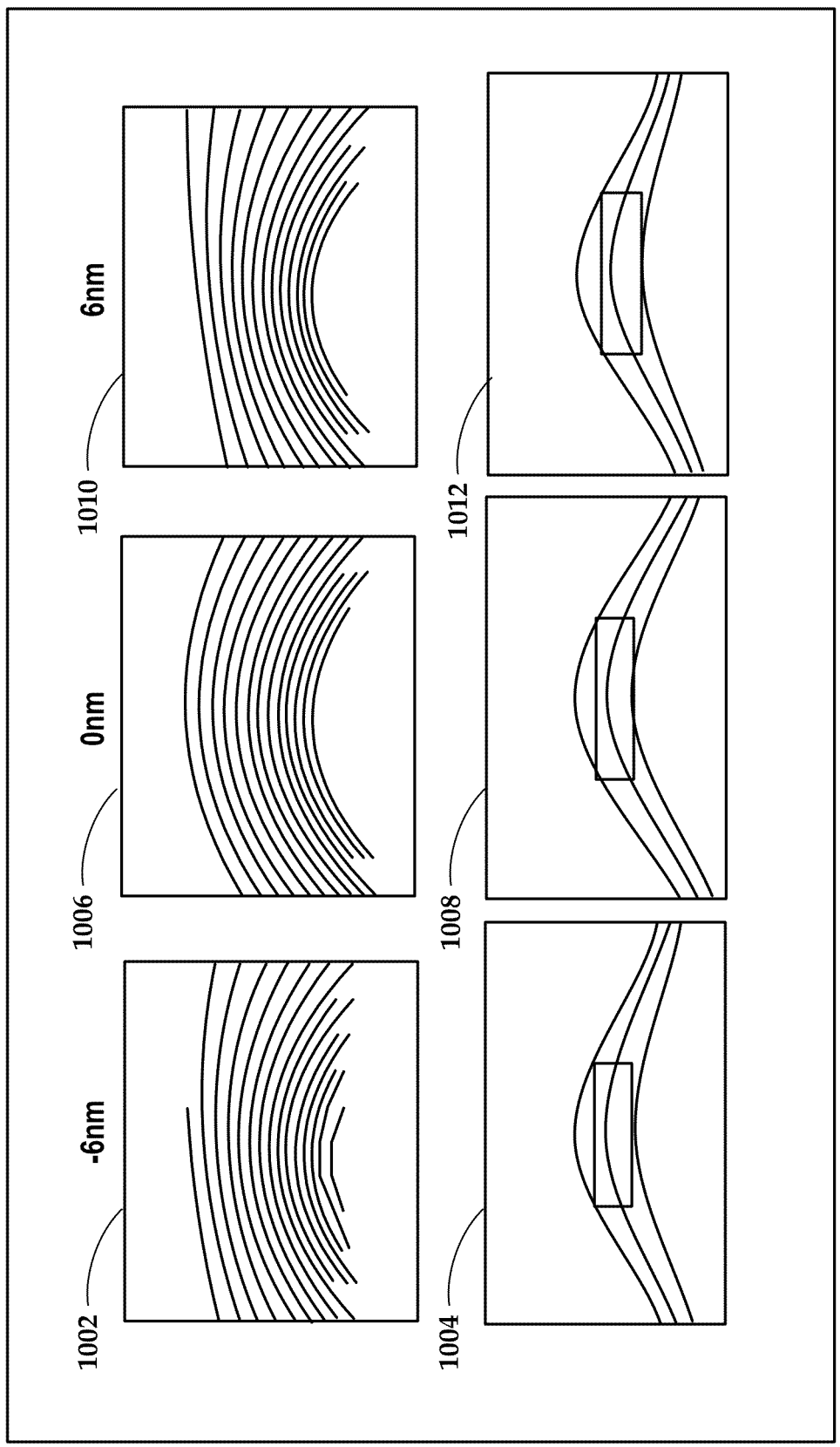
FIG. 10 is a collection of plots illustrating process sensitivity of offsetting a bridging feature according to example embodiments.

It was also considered whether introducing a shift in the phase edge of this magnitude will affect the process window. In FIG. 10, plots 1002, 1006, and 1010 illustrate process sensitivity of the bridging feature to focus and exposure for a 42 nm±5% CD target for offsets of −6 nm, 0 nm, and 6 nm, respectively. As these plots 1002, 1006, and 1010 show, there are only small changes for each of these offsets. Similarly, as seen in plots 1004, 1008, and 1012, the process window profiles are substantially similar using offsets of −6 nm, 0 nm, and 6 nm, respectively.

Figures 11A, 11B:
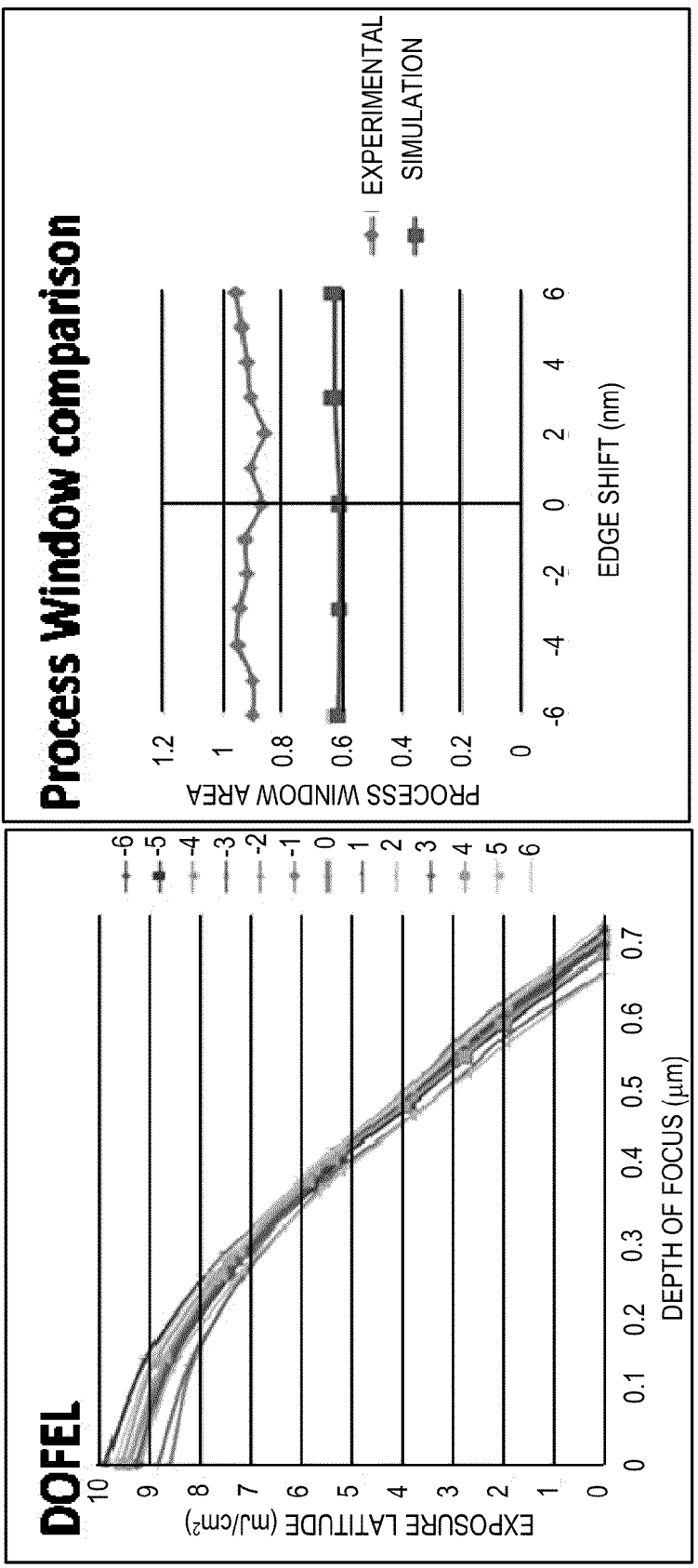
FIG. 11A is a depth-of-focus/exposure latitude graph illustrating process sensitivity of offsetting a bridging feature according to example embodiments.
FIG. 11B is a comparison of experimental and simulated process window areas for an offset bridging feature according to example embodiments.

In FIG. 11A, a depth-of-focus/exposure latitude (DOFEL) graph shows a closely grouped set of curves for offsets ranging from −6 nm to +6 nm. In FIG. 11B, experimental and simulated process window areas are compared, for offsets ranging from −6 nm to +6 nm. In both these cases, the process window is for a 42 nm±5% CD target.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
    forming first and second anchor features on a photolithography mask, each having a respective center point;
    forming an elongated, chromeless, bridging feature between the anchor features, wherein the bridging feature is offset from the center points of the anchor feature to minimize distortions of a corresponding photoresist feature formed by the bridging feature; and
    forming a feature of a read/write head using a region of interest of the corresponding photoresist feature.

2. The method of claim 1, wherein the corresponding photoresist feature extends between center points of respective anchor photoresist features formed by the first and second anchor features of the photolithography mask.

3. The method of claim 1, wherein the corresponding photoresist feature is a line, and wherein the offset minimizes bending along a length of the corresponding photoresist feature.

4. The method of claim 1, wherein the first and second anchor features are formed from an opaque material.

5. The method of claim 1, wherein a span of the corresponding photoresist feature is at least ten times greater than a width of the corresponding photoresist feature.

6. The method of claim 5, wherein the width of the corresponding photoresist feature is between 30 nm and 50 nm.

7. A photolithography mask, comprising:
    first and second anchor features each having a respective center point; and
    an elongated, chromeless, bridging feature extending between the anchor features, wherein the bridging feature is offset from the center points of the anchor feature to minimize distortions of a corresponding photoresist feature formed by the bridging feature;
    wherein a region of interest of the corresponding photoresist feature is used to form a feature of a read/write head.

8. The photolithography mask of claim 7, wherein the corresponding photoresist feature extends between center points of respective anchor photoresist features formed by the first and second anchor features of the photolithography mask.

9. The photolithography mask of claim 7, wherein the bridging feature is a line, and wherein the offset minimizes bending along a length of the corresponding photoresist feature.

10. The photolithography mask of claim 7, wherein the first and second anchor features comprise an opaque material.

11. The photolithography mask of claim 7, wherein a span of the corresponding photoresist feature is at least ten times greater than a width of the corresponding photoresist feature.

12. The photolithography mask of claim 11, wherein the width of the corresponding photoresist feature is between 30 nm and 50 nm.

13. An article of manufacture comprising a read/write head prepared by a process comprising:
    forming photoresist anchor features on the article of manufacture via first and second anchor features of a photolithography mask, each of the first and second anchor features having a respective center point;
    forming a bridging photoresist feature on the article of manufacture between the anchor features via a bridging feature of the photolithography mask, wherein the bridging feature is offset from the center points of the anchor feature to minimize distortions of the bridging photoresist feature; and
    forming a feature of the read/write head using a region of interest of the bridging feature.

14. The article of manufacture of claim 13, wherein a width of the bridging photoresist feature is between 30 nm and 50 nm, and wherein a span of the bridging photoresist feature is at least ten times greater than the width of the bridging photoresist feature.

15. The article of manufacture of claim 13, wherein the bridging photoresist feature extends between center points of the photoresist anchor features.

16. The article of manufacture of claim 13, wherein the bridging photoresist feature is a line, and wherein the offset minimizes bending along a length of the bridging photoresist feature.

17. The article of manufacture of claim 13, wherein the first and second anchor features comprise an opaque material.

* * * * *